(12) United States Patent
Szajnowski et al.

(10) Patent No.: US 7,209,521 B2
(45) Date of Patent: Apr. 24, 2007

(54) GENERATION OF A SEQUENCE OF PULSE TRAINS

(75) Inventors: Wieslaw Jerzy Szajnowski, Guildford (GB); Paul A Ratliff, Carshalton beeches (GB)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 740 days.

(21) Appl. No.: 10/347,229

(22) Filed: Jan. 21, 2003

(65) Prior Publication Data

US 2005/0261834 A1    Nov. 24, 2005

(30) Foreign Application Priority Data

Jan. 21, 2002    (EP)    .................................. 02250394

(51) Int. Cl.
*H04L 27/00*    (2006.01)
(52) U.S. Cl. ..................................................... 375/259
(58) Field of Classification Search ................ 375/130, 375/138, 343, 259, 377; 455/226.4; 342/378; 708/250–256
See application file for complete search history.

(56) References Cited

U.S. PATENT DOCUMENTS

| | | | |
|---|---|---|---|
| 3,475,558 A | 10/1969 | Cahn | |
| 4,471,342 A | 9/1984 | Gutleber | |
| 4,675,851 A | 6/1987 | Savit et al. | |
| 5,465,405 A * | 11/1995 | Baseghi et al. | 455/226.4 |
| 6,381,261 B1 * | 4/2002 | Nagazumi | 375/138 |
| 2002/0112855 A1 * | 8/2002 | Arndt et al. | 166/250.15 |

FOREIGN PATENT DOCUMENTS

| | | |
|---|---|---|
| EP | 1 033 271 A1 | 6/2000 |
| WO | WO 01/97477 A2 | 12/2001 |

OTHER PUBLICATIONS

Fan, Pingzhi et al, Research Studies Press Ltd., UK XP-002204796, 1996, paragraph 14.6, pp. 363-366.

* cited by examiner

*Primary Examiner*—Don N. Vo
(74) *Attorney, Agent, or Firm*—Birch, Stewart, Kolasch & Birch, LLP

(57) ABSTRACT

A pulse sequence is produced by repeatedly selecting individual pulse trains at random from a set thereof, each pulse train meeting predetermined autocorrelation constraints and the pulse trains collectively meeting predetermined cross-correlation constraints. The pulse trains are preferably separated by gaps of random length. At least some pulse trains may be time-reverse replicas of others. The resulting sequences are particularly suitable for obstacle detection in multiuser environments.

14 Claims, 8 Drawing Sheets a)

b)

GENERATION OF A SEQUENCE OF PULSE TRAINS

FIELD OF THE INVENTION

This invention relates to a method and apparatus for generating pulse trains, for example to be utilized in obstacle-detection systems and particularly, but not exclusively, in automotive blind-spot warning systems designed to operate in multiuser environments.

BACKGROUND OF THE INVENTION

One important type of automotive blind-spot warning systems employs short pulses of electromagnetic or ultrasonic energy to interrogate the detection zone. A decision regarding the presence or absence of an obstacle at a predetermined range is then made by suitably processing energy backscattered by various objects in the field of view of the system.

FIG. 1 is a block diagram of a typical obstacle-detection system utilizing short pulses of electromagnetic energy. The system comprises a pulse generator PGR that produces repetitively pulses with duration $T_P$ so selected as to provide required range resolution $\Delta R$. The pulse repetition period $T_{REP}$ may be constant or may vary in some specified manner. The system also has an oscillator OSC that generates a sinusoidal signal with required carrier frequency, a pulse modulator PMD that modulates the carrier signal in an on-off fashion, a power amplifier PAM that amplifies the pulsed carrier signal to a required level, a transmit element TEL that radiates pulses of electromagnetic energy towards an obstacle OBS, a suitable receive sensor REL that receives electromagnetic pulses reflected back by the obstacle OBS, an input amplifier IAM that amplifies the signal provided by the receive sensor REL, a signal conditioning unit SCU that employs suitable signal processing to shape the received pulses, and a pulse-coincidence processor PCP that processes jointly the reference pulses supplied by the generator PGR and reconstructed pulses supplied by the signal conditioning unit SCU to provide a decision DEC regarding the presence or absence of an obstacle at a predetermined range.

Usually, the input amplifier IAM is blanked during pulse transmission intervals, in order to suppress an undesired leakage signal originating in the transmitter. The required blanking function is accomplished by applying pulses provided by the generator PGR to the blanking input BI of the amplifier IAM.

FIG. 2 is a block diagram of a multichannel pulse-coincidence processor PCP utilized by the obstacle-detection system of FIG. 1. The processor has a decision block DBK and a plurality of channels, each comprising a suitable delay unit DELN, a coincidence gate CG and a coincidence counter CCR. The plurality of delay values, DEL1, DEL2, . . . ,DELJ, corresponds to a plurality of range values of interest, referred to as range gates. In each channel, reference pulses provided by the generator PGR are suitably delayed and applied to one input of coincidence gate CG, whose other input is driven by pulses reconstructed by signal conditioning unit SCU. When a pulse coincidence occurs, the counter CCR adds a one to the already accumulated number of coincidences. At the end of a prescribed observation period, each coincidence counter CCR supplies the number G of accumulated pulse coincidences to the decision block DBK. The decision block DBK selects the greatest of the supplied numbers, G1, G2, . . . , GJ, and compares this maximum value with a suitable decision threshold DT. If the decision threshold has been exceeded, then the decision block DBK declares, at the output DEC, an obstacle present in the range gate that exhibits the greatest number of observed coincidences.

FIG. 3 depicts a periodic pulse sequence comprising rectangular pulses of duration $T_P$ and repetition period $T_{REP}$. The range resolution depends on the pulse duration $T_P$ and the unambiguous range of the system depends on the period $T_{REP}$.

It is known that target detectability can be improved significantly when a single pulse is replaced by a suitably constructed pulse packet. Consequently, a basic periodic pulse sequence, such as the one depicted in FIG. 3, can be replaced by a sequence of successive pulse packets (also referred to herein as pulse trains).

In this arrangement, each pulse packet comprises a specified number N of identical pulses which are staggered nonuniformly, with each interpulse spacing being an integer multiple of a suitably chosen unit time interval. The pattern of interpulse spacings is so designed as to ensure that only a small number $h_a$ of pulse coincidences (preferably at most one pulse coincidence) will occur between a primary pulse packet and its replica shifted in time by more than one pulse duration. This condition is usually referred to as the autocorrelation constraint.

Consider a pulse packet of span (length) L comprising N identical rectangular pulses of unit duration. Such a pulse packet can be conveniently represented by a binary sequence $\{x\}=x_1 x_2 \ldots x_L$ of symbols 0 and 1, in which symbol 1 corresponds to pulse occurrence. In this case, the autocorrelation constraint can be expressed as $$R_{xx}(d) = \sum_{i=1}^{L-d} x_i x_{i+d} \leq h_a < N, \quad 0 < d \leq L-1$$

where $R_{xx}(d)$ is the autocorrelation sequence and d is the integer shift. When d=0, the autocorrelation value $R_{xx}(0)$ simply equals the number N of pulses contained within the pulse packet.

In the class of all pulse packets with a specified number of pulses N and $h_a=1$, a maximally compact pulse packet has the minimal span $L_{min}$. Consequently, the maximally compact pulse packet exhibits the largest duty factor, N/L, and the largest average power. For a fixed N and $h_a=1$, all pulse packets with spans greater than $L_{min}$ are referred to as sparse pulse packets.

FIG. 4 depicts a pulse packet of span L=36 comprising N=8 pulses which are placed at locations 1, 8, 11, 17, 19, 31, 32 and 36. The pulse packet can be represented by the following binary sequence $\{x\}$ $\{x\}=100000010010000101000000000110001$ The autocorrelation sequence $R_{xx}(d)$ of $\{x\}$ is shown in FIG. 5a. The peak value of $R_{xx}(d)$ occurs at zero shift, i.e. $R_{xx}(0)=8$; for other shifts d, the function $R_{xx}(d)$ assumes a value of either zero or one ($h_a=1$). While the autocorrelation sequence $R_{xx}(d)$ fully characterises the binary sequence $\{x\}$, the corresponding pulse packet is usually characterised by the autocorrelation function $R_{xx}(\tau)$, where the parameter $\tau$ denotes continuous time delay (shift). The autocorrelation function $R_{xx}(\tau)$ of the pulse packet represented by $\{x\}$ is shown in FIG. 5b, where $\Delta$ denotes the unit time interval. Both the autocorrelation sequence $R_{xx}(d)$ and the autocorrelation function $R_x(\tau)$ are even functions of their respective arguments.

The autocorrelation constraint ensures that when there is no noise or interference, and a multichannel pulse-coincidence processor is used for detecting a pulse packet, the output of each channel is at most $h_a$ except when the channel delay matches that of a pulse packet being received. In this case, the channel output reaches the peak value of N.

In practical systems, in order to suppress undesired leakage from the transmitter, the receiver is usually blanked during pulse transmission intervals. The autocorrelation constraint $R_{xx}(d) \leq 1$ implies that when the pulse packet being received overlaps the pulse packet being transmitted, at most one received pulse in a target return will be lost.

In a multiuser environment, the users may transmit their signals. simultaneously and asynchronously so that not only must each receiver recognize and detect its own transmitted signal, but it must be able to do so in the presence of the other transmitted signals. Assume that a pulse packet to be detected by a receiver of interest is represented by a binary sequence $$\{x\} = x_1 x_2 \ldots x_L$$

and that one of the interfering pulse packets is represented by another binary sequence $$\{y\} = y_1 y_2 \ldots y_L$$

In order to optimize the detection performance of the receiver in multiuser environment, the following cross-correlation constraints must be satisfied for all integer shifts d $$R_{xy}(d) = \sum_{i=1}^{L-d} x_i y_{i+d} \leq h_c < N, \quad 0 < d \leq L-1$$

and $$R_{yx}(d) = \sum_{i=1}^{L-d} y_i x_{i+d} \leq h_c < N, \quad 0 < d \leq L-1$$

When more than one transmitter is in operation, the auto-correlation and cross-correlation constraints combined together ensure that, when there is no noise and a multi-channel pulse-coincidence processor is used for detection, the output of each channel is still substantially less than N except when the channel delay matches that of a received pulse packet of interest.

Various techniques have been developed to construct sets of binary sequences with good autocorrelation and cross-correlation properties (see for example P. Fan and M. Darnell, *Sequence Design for Communications Applications*. Wiley, 1996). However, these are generally only of limited use in automotive obstacle-detection systems designated to operate in multiuser environment, as they would produce multiple different long sequences exhibiting a very low duty factor, hence the resulting detection performance will be significantly degraded.

In automotive applications, many similar obstacle-detection systems should be capable of operating in the same region, also sharing the same frequency band. To avoid mutual interference, each system should use a distinct signal, preferably uncorrelated with the signals employed by all other systems. Because it is not possible to predict which of the many similar systems will be operating in a particular environment, it is not practical to assign a distinct binary sequence to each of them. Furthermore, it is also very difficult to construct large sets of binary sequences with good autocorrelation and cross-correlation properties, and also exhibiting acceptable duty factors.

STATEMENT OF INVENTION

It would therefore be desirable to provide a method for generating a large number of long randomized binary sequences with good autocorrelation and cross-correlation properties, especially sequences which can be utilized in automotive obstacle-detection systems to operate in multiuser environments.

Aspects of the present invention are set out in the accompanying claims.

According to another aspect, a sequence of pulse trains is formed by separating individual pulse trains by gaps of random duration, which may be determined by a random value supplied by a random number generator.

FIG. 6 shows the structure of a first composite pulse train constructed according to this aspect of the present invention. The composite pulse train comprises primary pulse packets separated by empty time intervals, referred to as gaps. Each gap consists of a regular gap and a random gap; a regular gap has a fixed duration $T_{RE}$, whereas the duration $T_{RA}$ of a random gap is a random variable.

The duration $T_{PP}$ of each primary pulse packet is defined as the shortest time interval containing all pulses in the packet. Consequently, $T_{PP} = L \cdot T_P$, where L is the packet span and $T_P$ is the duration of a single pulse. In the following, it will be assumed that the duration of a single pulse is equal to the period $T_{CLK}$ of a clock frequency; hence $T_P = T_{CLK}$.

The duration $T_{RE}$ of a regular gap is so chosen as to retain the autocorrelation and cross-correlation properties of pulse packets utilized to construct a composite pulse train. Preferably, the duration of a regular gap is no greater than that of the longest primary pulse packet being used; hence $T_{RE} \leq L_{max} \cdot T_{CLK}$. In the case of maximally compact pulse packets, the duration of a regular gap will be slightly less than that of the packet. However, in the case of sparse pulse packets, the duration of a regular gap may be as small as just a few clock periods $T_{CLK}$, or it may even be equal to zero.

Preferably, the duration $T_{RA}$ of each random gap has a uniform distribution over some specified interval. Preferably, one end point of such interval is a zero, whereas the other end point assumes a value which may for example be between three and fifteen multiples of a clock period $T_{CLK}$.

Although random gaps shown in FIG. 6 are appended to trailing pulses of primary pulse packets, random gaps may be inserted anywhere between adjacent packets. In the following, a primary pulse packet augmented with a random gap will be referred to as a randomized pulse packet. Hence, the total duration of each randomized pulse packet is equal to $(T_{PP} + T_{RA})$, and the randomized packets are separated by regular gaps of duration $T_{RE}$.

Thus, identical copies of a single primary pulse packet can be utilized to produce a large number of randomized pulse packets by appending a realization of a random gap to a copy of the underlying primary pulse packet. All such constructed randomized pulse packets will have the same autocorrelation function.

According to another aspect of the present invention, a composite pulse train is formed of a sequence of primary pulse packets each of which is drawn at random from a predetermined set of suitably constructed primary pulse packets with prescribed autocorrelation and cross-correlation properties.

For optimum detection performance, the autocorrelation function of each primary pulse packet should exhibit the property of 'at most one coincidence'. Moreover, the cross-correlation function between any two different primary pulse packets should assume small values compared to the maximum value of the corresponding autocorrelation functions.

In order to ensure power efficiency for a specified number of pulses, an optimum composite pulse train should exhibit a large value of the average duty factor ADF, defined by $$ADF = N/[L + (T_{RE} + T_{ARA})/T_{CLK}]$$

where N is the number of pulses in a primary pulse packet, L is the packet span, $T_{RE}$ is the duration of a regular gap, $T_{ARA}$ is the mean duration of a random gap, and $T_{CLK}$ is the clock period.

Excellent resistance to mutual jamming in multiuser environments can be obtained by exploiting random mechanisms for constructing composite pulse trains. Although each user has the same set of primary pulse packets, a composite pulse train is assembled by each user in a random manner by repetitive random selection of randomized pulse packets.

According to a further preferred aspect of the present invention, a primary pulse packet with desired autocorrelation properties is used to construct another primary pulse packet with the same autocorrelation properties by reversing in time the first primary pulse packet. The cross-correlation function between these two dual primary pulse packets will not exceed values greater than two.

FIG. 7a shows an example of a primary pulse packet, and FIG. 7b shows another primary pulse packet, being a mirror image of the first packet. FIG. 8 depicts cross-correlation between two binary sequences that represent those two pulse packets. The cross-correlation function is asymmetric and it assumes, for different shifts, one of three values, 0, 1, or 2.

In a preferred embodiment of the invention, some, and preferably all, of these aspects are combined to provide a substantial number of different pulse sequences which are suited for use in a multiuser environment.

BRIEF DESCRIPTION OF THE DRAWINGS

Arrangements embodying the invention will now be described by way of example with reference to the accompanying drawings, in which.

DESCRIPTION OF PREFERRED
EMBODIMENTS OF THE INVENTION

Figure 9:
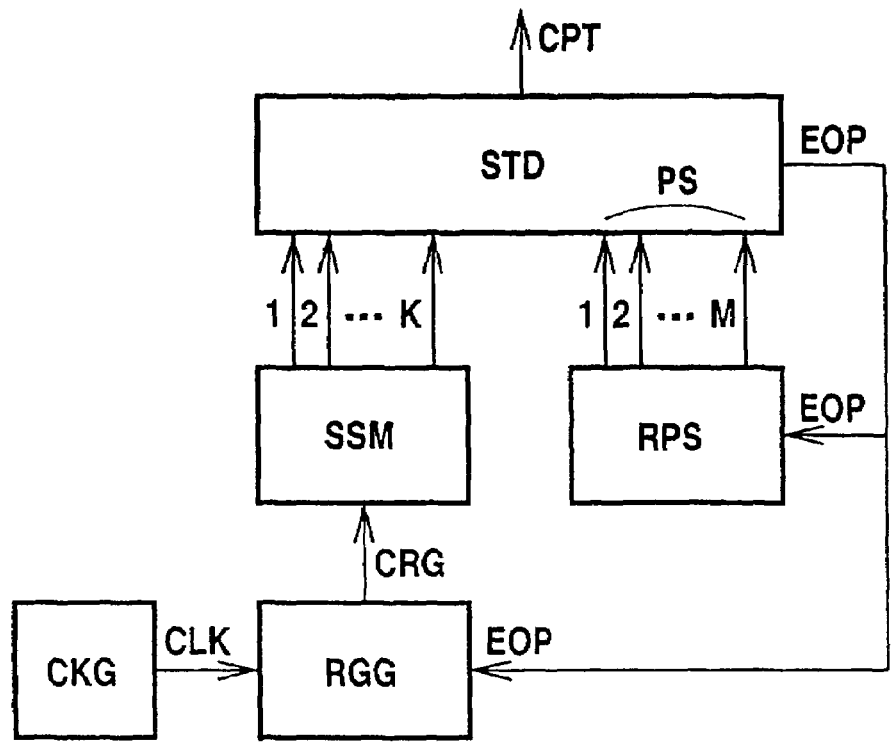
FIG. 9 is a block diagram of a system for generating composite pulse trains according to the present invention.

FIG. 9 is a block diagram of a system for generating composite pulse trains according to one preferred embodiment of the present invention. The system comprises a sequential state module SSM, a state decoder STD, a random packet selector RPS, a random gap generator RGG and a clock generator CKG.

During the system operation, the sequential state module SSM changes its state successively at the time instants determined by clock pulses CLK supplied by the clock generator CKG. The total number NS of distinct states of the sequential state module SSM should be at least equal to the span $L_{max}$ of the longest primary pulse packet used by the system; hence $$NS = 2^K \geq L_{max}$$

where K is the number of flip-flops utilized by the sequential state module SSM. Redundant states of the sequential state module SSM may be employed for generating a regular gap, and the remaining states, if any, should be eliminated. If the number ($NS - L_{max}$) of redundant states is too small to generate a complete regular gap, the remaining part of the gap, or even the whole regular gap, can additionally be supplied by a random gap generator RGG.

The sequential state module SSM is arranged to operate cyclically, each cycle comprising NU distinct states selected in some convenient manner from the total number $NS = 2^K$ of available distinct states. Among those NU distinct states, there are N predetermined states representing the positions of pulses in each pulse packet to be generated.

The function of the sequential state module SSM can be implemented by a conventional binary counter, by a shift register with a suitable feedback or by a similar sequential state machine well known to those skilled in the art.

The state decoder STD is driven by a K-bit output of the sequential state module SSM, and also by an M-bit packet select input PS. The state decoder STD has two outputs: one output supplies a composite pulse train CPT, whereas the other produces an end-of-packet EOP pulse. For example, an EOP pulse may coincide with the trailing pulse of every pulse packet. The EOP pulse is utilized to initiate operations performed by the random packet selector RPS and the random gap generator RGG.

The packet select input PS is represented by M bits that may only change when the pulse packet generation has been completed. For any given packet select PS input, the state decoder STD produces a single pulse each time the sequential state module SSM assumes one of N predetermined states. A complete primary pulse packet is obtained at the output CPT of the state decoder STD during each full cycle of the sequential state module SSM.

When the M-bit PS input changes, the state decoder STD will produce at CPT a different primary pulse packet by decoding a different set of predetermined states. The system is arranged to operate in such a manner that the number $2^M$ of different PS input values is equal to the number of primary pulse packets to be generated. Each pulse packet is predefined and meets the autocorrelation and cross-correlation constraints mentioned above. Some of the predefined pulse packets may be time-reversed replicas of other pulse packets.

An M-bit PS input is provided by the output of a random packet selector RPS that determines which one of the available $2^M$ packets will be produced during a particular full cycle of the sequential state module SSM.

All functions of the state decoder STD can be implemented by a combinational logic or by a suitably programmed read-only memory.

The random gap generator RGG appends a random gap to the trailing pulse of every primary pulse packet being produced. Each cycle of the repetitive operation of the random gap generator RGG is initiated by an EOP pulse supplied by the state decoder STD. The random gap is inserted by inhibiting a random number of clock pulses provided by the clock generator CKG. The output CRG of the random gap generator RGG supplies a sequence of clock pulses in which a random number of consecutive pulses are missing. As a result, the operation of the sequential state module SSM is suspended during a random time interval equal to the duration of the random gap. Preferably, the duration of each random gap is uniformly distributed, and the random gaps are formed independently of each other. If required, the random gap generator RGG can also supply a fraction of a regular gap or even a complete regular gap.

Figure 10:
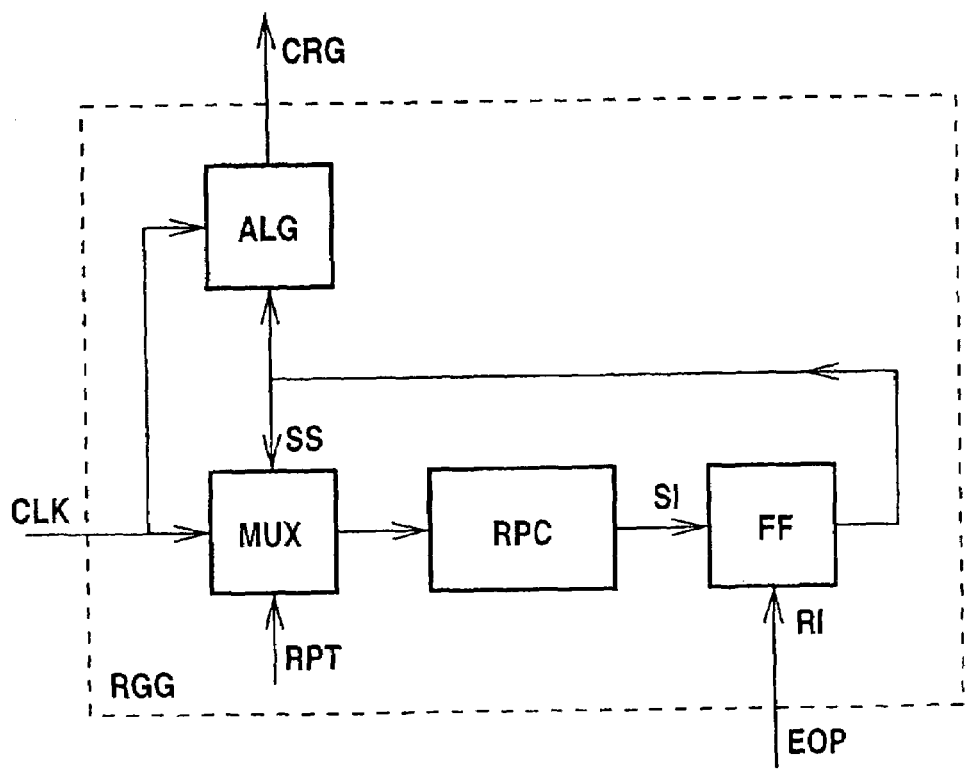
FIG. 10 is a block diagram of a random gap generator for apparatus according to the present invention.

FIG. 10 is a block diagram of a random gap generator RGG. The random gap generator RGG comprises a random pulse counter RPC, a two-input multiplexer MUX, a flip-flop FF and an AND logic gate ALG. The random gap generator RGG utilizes a random pulse train RPT with a sufficiently high pulse rate. A suitable device for providing the random pulse train RPT will be evident to the skilled man.

The random pulse counter RPC capacity is determined by the assumed largest value of a random gap. The random pulse counter RPC capacity should be small compared to the total number of random pulses supplied by the random pulse train RPT during one cycle of the sequential state module SSM. As a result, the random pulse counter RPC will overflow a large number of times during each sequential state module SSM cycle, and only the fractional part of the total number of applied random pulses will be retained in the random pulse counter RPC at the time instants coinciding with EOP pulses. This fractional part is distributed uniformly over all counter states, irrespective of the underlying statistics of random pulses occurring in a random pulse train RPT.

The multiplexer MUX operates as follows: when the binary source select input SS=1, the random pulse counter RPC receives a random pulse train RPT, and when SS=0, the random pulse counter RPC receives clock pulses CLK.

Prior to the occurrence of an end-of-packet EOP pulse, the flip-flop FF is in state '1' (hence, also SS=1), clock pulses appear at the output of the AND gate ALG, and the random pulse train RPT is applied to the random pulse counter RPC via the multiplexer MUX. As soon as an EOP pulse is applied to the reset input RI of the flip-flop FF, the flip-flop FF will assume state '0' and no clock pulses CLK will appear at the output of the AND gate ALG. Because the flip-flop FF also drives the SS input of the multiplexer MUX, now SS=0 and clock pulses CLK are applied to the random pulse counter RPC via the multiplexer MUX. The number of clock pulses required to bring the random pulse counter RPC from its initial random state to the overflow state is a random and uniformly distributed number.

As soon as the overflow occurs, a suitable signal is applied to the set input SI of the flip-flop FF, and the flip-flop FF assumes state '1'. Because now SS=1, the random pulse counter RPC will resume counting (with overflow) random pulses in the random pulse train RPT, and clock pulses CLK will appear again at the output of the AND gate ALG.

The above procedure results in inserting a random gap into a sequence of clock pulses appearing at the output of the AND gate ALG. The duration of the random gap is equal to the random number of clock pulses CLK required to make the random pulse counter RPC overflow. Therefore, the duration of the random gap has a uniform distribution.

The specific overflow condition due to counting clock pulses CLK forces the random pulse counter RPC to assume an initial state '0', before the random pulse counter RPC restarts counting random pulses in the random pulse train RPT. Because of a large number of overflows resulting from counting random pulses, the random states of the random pulse counter RPC are assumed to be statistically independent at the time instants determined by the occurrence of end-of-packet EOP pulses.

When a random pulse train RPT is not available, or when the pulse rate in the available random pulse train RPT is too low for a large number of overflows to occur in the random pulse counter RPC during each full cycle of the sequential state module SSM, a modified random gap generator MRGG can be employed.

Figure 11:
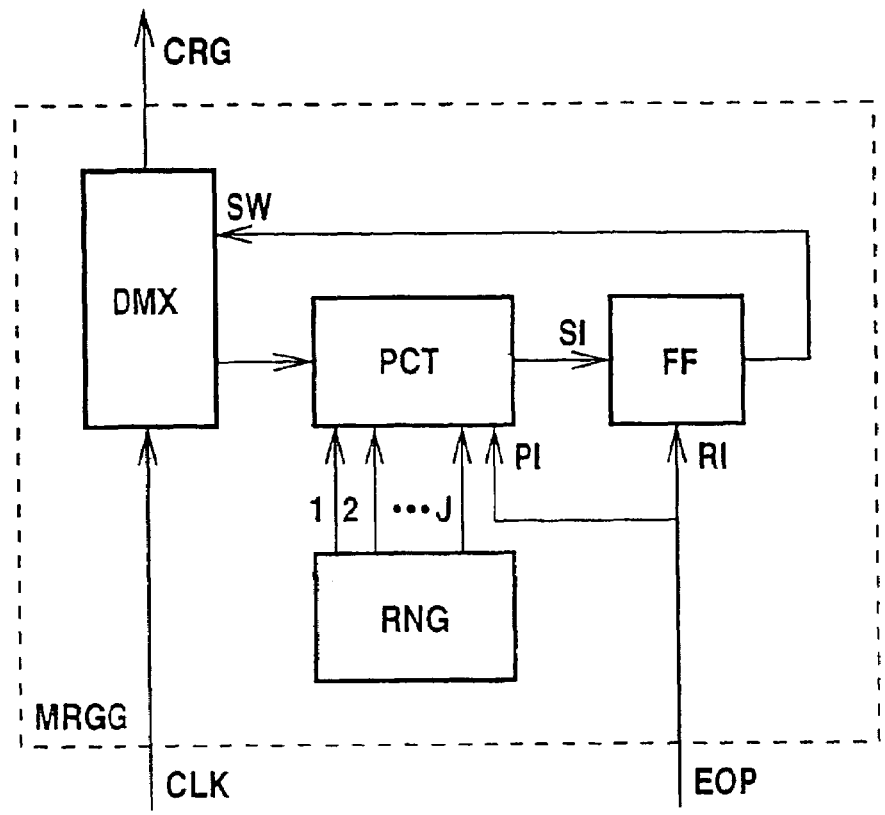
FIG. 11 is a block diagram of a modified random gap generator.

FIG. 11 is a block diagram of a modified random gap generator MRGG. The modified random gap generator MRGG comprises a pulse counter PCT, a demultiplexer DMX and a flip-flop FF. The modified random gap generator MRGG also utilizes independent and uniformly distributed J-bit random numbers. The random numbers can be supplied by a random number generator RNG; a suitable type will be evident to one skilled in the art.

The demultiplexer DMX operates as follows: when the binary switch input SW=0, clock pulses CLK are applied to the pulse counter PCT, and when SW=1, clock pulses CLK are diverted to the modified random gap generator MRGG output.

Prior to the occurrence of an end-of-packet EOP pulse, the flip-flop FF is in state '1' and, because SW=1, clock pulses CLK appear at the output CRG. As soon as an EOP pulse is applied to the reset input RI of the flip-flop FF, the flip-flop FF will assume state '0'. Because now SW=0, clock pulses CLK do not appear at output CRG but they are diverted (via the demultiplexer DMX) to the pulse counter PCT.

The EOP pulse is also applied to the preload input PI of the pulse counter PCT to set the initial state of the pulse counter PCT to a random J-bit number supplied by a random number generator RNG. The number of the clock pulses required to bring the pulse counter PCT from its initial random state to the overflow state is a random and uniformly distributed number.

As soon as the overflow occurs in the pulse counter PCT, a suitable signal is applied to the set input SI of the flip-flop FF, and the flip-flop FF assumes state '1'. Because now SW=1, the clock pulses are diverted to the output CRG.

The above procedure results in inserting a random gap into a sequence of clock pulses appearing at the output CRG of the modified random gap generator MRGG. The duration of the random gap is equal to the random number of clock pulses required to make the pulse counter PCT overflow.

Either configuration of the random gap generator, RGG or MRGG, can be altered to include a means for appending also a regular gap of a prescribed duration. For example, in the modified random gap generator MRGG arrangement, the pulse counter PCT, having accumulated enough clock pulses to reach the overflow state, will continue to count clock pulses until some predetermined state is reached. Therefore, the total duration of the gap inserted into the clock pulse train will comprise two components: a random gap and a regular (deterministic) gap. The value of the random gap is dependent on the number of pulses occurring between the initial random state and the overflow state, whereas the value of the regular gap is equal to the number of clock pulse periods $T_{CLK}$ between the overflow state and another predetermined state.

The random packet selector RPS supplies a random number, when prompted by the end-of-packet EOP pulse sent from the state decoder STD. Preferably, the supplied random numbers are statistically independent and uniformly distributed so that each primary pulse packet will be generated with the same probability and independently of all other packets.

Figure 12:
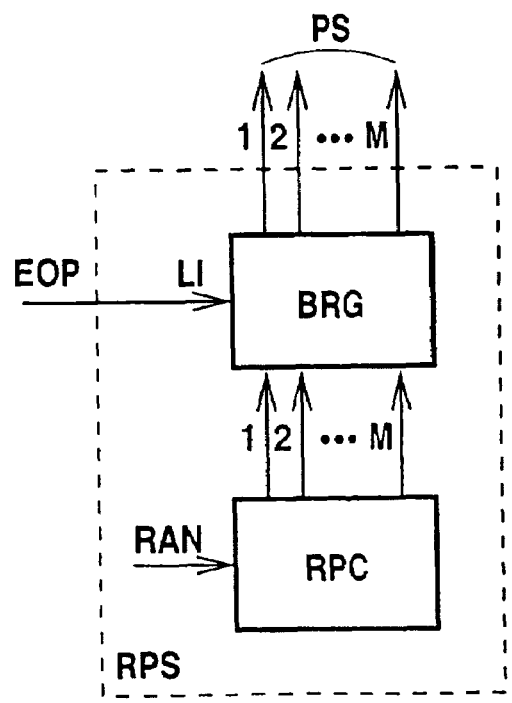
FIG. 12 is a block diagram of a random packet selector for apparatus according to the present invention.

FIG. 12 is a block diagram of a random packet selector RPS according to the present invention. The random packet selector RPS comprises a random pulse counter RPC and a suitable buffer register BRG. For its operation, the random packet selector RPS utilizes a random pulse train RAN with sufficiently high pulse rate. A random pulse train RAN can be supplied by a suitable source of a type well known in itself.

The random pulse counter RPC counts, with cyclic overflow, random pulses occurring in the random pulse train RAN. An end-of-packet EOP pulse, applied to the load input LI of the buffer register BRG, executes the transfer of the current random pulse counter RPC state to the buffer register BRG. This random pulse counter RPC state is an M-bit random number distributed uniformly over all random pulse counter RPC states, irrespective of the statistics of the underlying random pulse train RAN.

The random M-bit number stored in the buffer register BRG is then used by the state decoder STD to determine which one of the available $2^M$ primary pulse packets will be produced during a particular cycle of the sequential state module SSM. The system is arranged to operate in such a manner that the value $2^M$ is equal to the total number of primary pulse packets utilized in the process of generating a composite pulse train CPT.

When a random pulse train RAN is not available, or when the pulse rate in the available random pulse train RAN is too low to ensure uniform distribution of the random pulse counter RPC states, the buffer register BRG can be loaded with a random number supplied by a separate random number generator of a type well known in itself.

Figure 13:
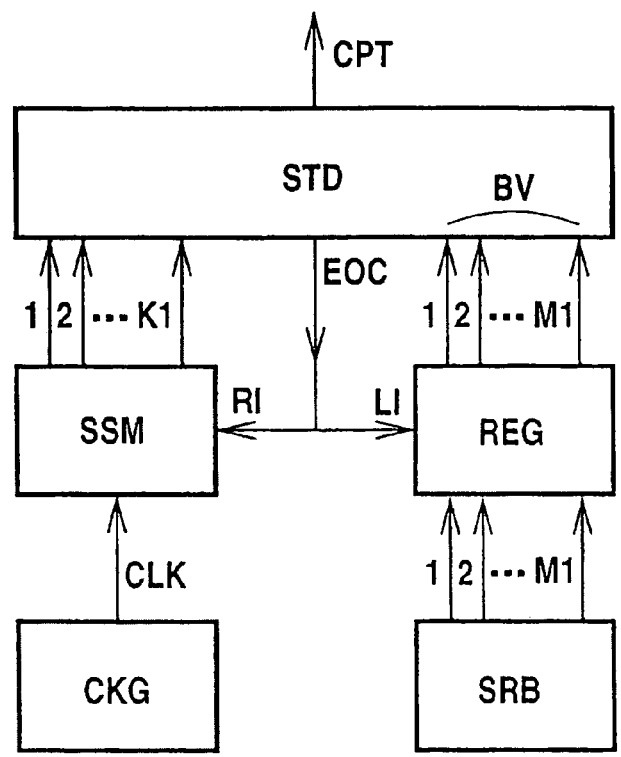
FIG. 13 is a block diagram of another system for generating composite pulse trains according to the present invention.

FIG. 13 is a block diagram of another system for generating composite pulse trains according to the present invention. The system comprises a sequential state module SSM, a state decoder STD, a source of random bits SRB, a storage register REG, and a clock generator CKG. It is assumed that the source SRB supplies random bits in parallel at sufficiently high rate. A suitable source of random bits will be evident to one skilled in the art.

The required number NR of distinct states of the sequential state module SSM can be determined from $$NR = L_{max} + (T_{RE} + T_{RAmax})/T_{CLK}$$

where $L_{max}$ is the span of the longest primary pulse packet, $T_{RE}$ is the duration of the regular gap, $T_{RAmax}$ is the duration of the longest random gap, and $T_{CLK}$ is the clock period. Therefore, the minimal number K1 of flip-flops to be utilized by the sequential state module SSM is equal to the smallest integer satisfying the inequality $$K1 \geq \log_2 NR$$

For example, if $L_{max}=36$, $T_{RE}/T_{CLK}=33$, $T_{RAmax}/T_{CLK}=31$, then NR=100 and the resulting minimum number of required flip-flops K1=7.

The function of the sequential state module SSM can be implemented by a conventional binary counter, by a shift register with a suitable feedback or by a similar sequential state machine well known to those skilled in the art.

During the system operation, the sequential state module SSM changes its state successively at the time instants determined by clock pulses CLK supplied by the clock generator CKG. At any time the sequential state module SSM can be reset to its initial state by applying a suitable signal to the reset input RI. Resetting the sequential state module SSM results in shortening the basic SSM cycle that comprises NR states.

The state decoder STD has K1 binary inputs driven by the sequential state module SSM and also M1 binary inputs driven by the source of random bits SRB via a storage register REG. Random bits supplied in parallel by the source SRB can be regarded as M1 components of a binary vector BV. The system is arranged to operate in such a manner that the number $2^{M1}$ of different realizations of the BV is equal to the number of all randomized pulse packets to be used. A composite pulse train appears at the output CPT of the state decoder STD.

For example, if there are available two different pulse packets and also their time-reversed replicas, and if the number of different random delays is 32, then the total number of randomized pulse packets equal to the number of binary vectors is 4×32=128; hence M1=7.

When an end-of-cycle EOC pulse is applied to the load input LI of the register REG, an M1-bit vector BV is transferred from the source SRB to the register REG. Then, the vector BV is retained in the register REG for the duration of the corresponding cycle of the system operation. Each binary vector BV supplies all information regarding the randomized pulse packet to be produced, i.e., both the information about the packet structure and the duration of the gap to be appended. This information, in conjunction with the state of the sequential state module SSM, contained in the K1 binary outputs of the sequential state module SSM, is utilized by the state decoder STD during each cycle of the system operation. While the binary vector BV remains unchanged during each cycle, the state of the sequential state module SSM changes sequentially with each clock pulse. In general, the duration of each cycle will differ because of the variability of the random gap.

During each cycle of the system operation, the state decoder STD:
1. produces one of the available pulse packets;
2. appends to the selected pulse packet one of the realizations of a random gap;

3. complements thus constructed realization of a randomized pulse packet with a deterministic gap;
4. produces an end-of-cycle EOC pulse employed to reset the sequential state module SSM to its initial state, and also to load a new binary vector BV into the storage register REG.

To perform the above functions, the state decoder STD processes jointly M1 bits of BV and K1 bits representing each state of the sequential state module SSM to decide at each clock pulse instant:
1. whether to produce a '0' or a '1' at the CPT output;
2. whether to produce a '0' or a '1' at the EOC output.

All functions of the state decoder STD can be implemented by a combinational logic or by a suitably programmed read-only memory.

To illustrate the logic design of the state decoder STD in the configuration of FIG. 13, assume that the system is to utilize a single pulse packet and its mirror image represented, respectively, by the two following binary sequences:

100110000101 and 101000011001

Therefore, N=5 and the packet span L=12. Suppose also that the span of a regular gap is $T_{RE}/T_{CLK}=9$, and the span of the random gap $T_{RA}/T_{CLK}$ can assume one of the four values: 0, 1, 2 or 3.

The basic parameters of the state decoder STD are as follows:
1. The number NR of the required SSM states is determined from $$NR=L_{max}+(T_{RE}+T_{RAmax})/T_{CLK}=12+9+3=24$$

2. The number of bits needed to represent 24 states, K1=5.
3. The total number of randomized packets $2\times4=8=2^{M1}$.
4. The number of components in the binary vector BV, M1=3.
5. The number of inputs of the state decoder STD, K1+M1=5+3=8.

Assume that the binary vector BV=(B2, B1, B0) has the following structure:

B2=0 corresponds to the pulse packet 100110000101, and B2=1 corresponds to its mirror image 101000011001. Bits (B1, B0) are the binary representation of the random shift value, e.g., (1,0) represents 2, and (1,1) represents 3.

The truth table for the combinational logic of the state decoder STD is summarised in Table 1. Because it is assumed that the reset operation is asynchronous, the initial state and the preceding end-of-cycle state will occur during a single clock period $T_{CLK}$. Consequently, the total number of required SSM states is increased by one to 25. The 25 states are numbered from 0 to 24; state '0' denoting the initial state.

TABLE 1

| Binary word BV | | | States of the sequential state module for which | | | | | |
|---|---|---|---|---|---|---|---|---|
| B2 | B1 | B0 | CPT = 1 | | | | | EOC = 1 |
| 0 | 0 | 0 | 1 | 4 | 5 | 10 | 12 | 21 |
| 0 | 0 | 1 | 1 | 4 | 5 | 10 | 12 | 22 |
| 0 | 1 | 0 | 1 | 4 | 5 | 10 | 12 | 23 |
| 0 | 1 | 1 | 1 | 4 | 5 | 10 | 12 | 24 |
| 1 | 0 | 0 | 1 | 3 | 8 | 9 | 12 | 21 |
| 1 | 0 | 1 | 1 | 3 | 8 | 9 | 12 | 22 |
| 1 | 1 | 0 | 1 | 3 | 8 | 9 | 12 | 23 |
| 1 | 1 | 1 | 1 | 3 | 8 | 9 | 12 | 24 |

For B2=0, the state decoder STD produces a '1' at its CPT output only when the sequential state module SSM assumes either of the states: 1, 4, 5, 10, 12. However, for B2=1, a '1' appears at the CPT output only when the sequential state module SSM assumes either of the states: 1, 3, 8, 9, 12. Each pulse packet is followed by a string of zeros representing combined regular and random gaps.

The EOC output produces a '1' when the sequential state module SSM cycle specified by a particular BV has been completed.

Table 2 shows an example of the full truth table for the state decoder STD for the binary vector BV=(0,1,0). In this case B2=0, and the span of a random gap is equal to two. Therefore, there are eleven zeros appended to the pulse packet: nine zeros representing the regular gap and two zeros representing the random gap. As soon as state '23' is reached, the sequential state module SSM is reset to the initial state '0'. Because the reset input RI is assumed to override synchronous operation of the sequential state module SSM, both the states '23' and '0' will occur during a single clock period $T_{CLK}$.

TABLE 2

| SSM states | CPT | EOC | |
|---|---|---|---|
| 0 | 0 | 0 | initial SSM state '0' |
| 1 | 1 | 0 | |
| 2 | 0 | 0 | |
| 3 | 0 | 0 | |
| 4 | 1 | 0 | |
| 5 | 1 | 0 | |
| 6 | 0 | 0 | |
| 7 | 0 | 0 | |
| 8 | 0 | 0 | |
| 9 | 0 | 0 | |
| 10 | 1 | 0 | |
| 11 | 0 | 0 | |
| 12 | 1 | 0 | |
| 13 | 0 | 0 | |
| 14 | 0 | 0 | |
| 15 | 0 | 0 | |
| 16 | 0 | 0 | |
| 17 | 0 | 0 | |
| 18 | 0 | 0 | |
| 19 | 0 | 0 | |
| 20 | 0 | 0 | |
| 21 | 0 | 0 | |
| 22 | 0 | 0 | |
| 23 | 0 | 1 | jump to the initial SSM state '0' |

Figure 14:
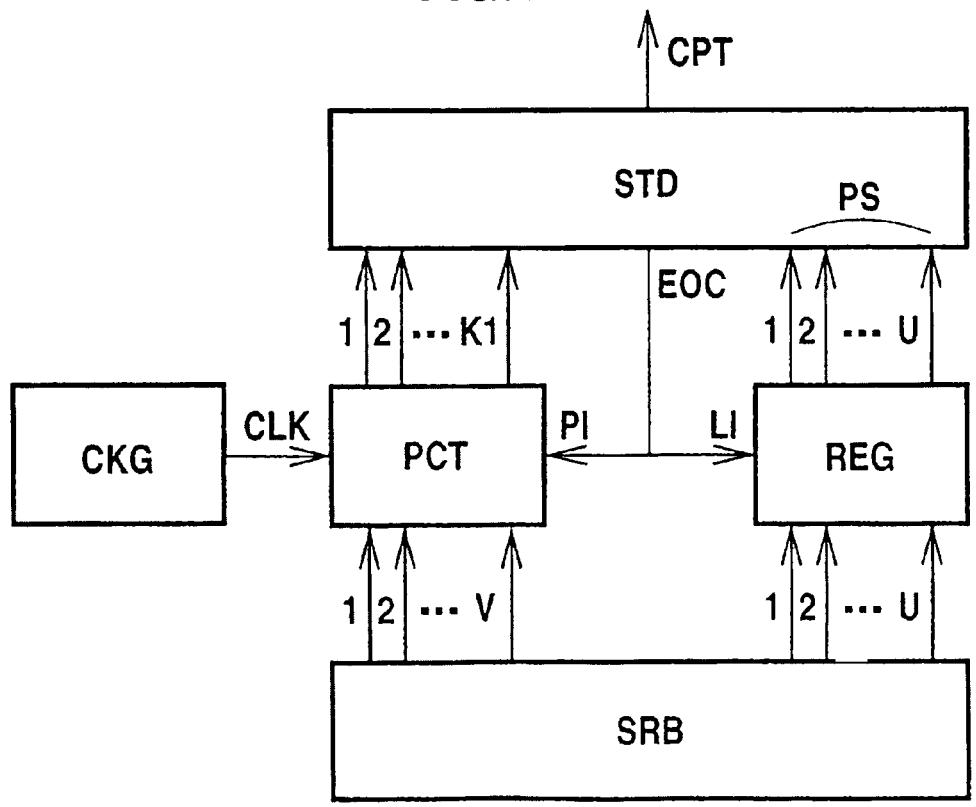
FIG. 14 is a block diagram of a further system for generating composite pulse trains according to the present invention.

FIG. 14 is a block diagram of another system for generating composite pulse trains according to the present invention. The system comprises a pulse counter PCT, a state decoder STD, a source of random bits SRB, a storage register REG and a clock generator CKG. It is assumed that the source SRB supplies random bits in parallel at sufficiently high rate. A suitable source of random bits will be evident to the skilled man.

The required number NR of distinct states of the pulse counter PCT can be determined from $$NR=L_{max}+(T_{RE}+T_{RAmax})/T_{CLK}$$

where $L_{max}$ is the span of the longest primary pulse packet, $T_{RE}$ is the duration of the regular gap, $T_{RAmax}$ is the duration of the longest random gap, and $T_{CLK}$ is the clock period. Therefore, the minimal number K1 of flip-flops to be employed by the pulse counter PCT is equal to the smallest integer satisfying the inequality $$K1 \geq \log_2 NR$$

In general, there will be ($2^{K1}$−NR) redundant states to be eliminated. Among the NR distinct states, there are N predetermined states representing the positions of pulses in each pulse packet to be generated.

During the system operation, the pulse counter PCT changes its state successively at the time instants determined by clock pulses CLK supplied by the clock generator CKG. In each cycle of system operation, the pulse counter PCT starts counting clock pulses CLK from some initial state defined by V bits supplied by the source SRB. The initial state of the pulse counter PCT is set by applying an end-of-cycle EOC pulse to the preload input PI of the pulse counter PCT.

When the random gap assumes its largest value $T_{RAmax}$, the counting process starts from a state designated as state '0'. However, for smaller values of $T_{RA}$, pulse counting starts from one of the states which follows state '0'. Therefore, before each cycle starts, the pulse counter PCT is advanced by a random number of clock pulses. The number of different initial states of the pulse counter PCT, being the same as the number of different realizations of random gap, is equal to $2^V$. In this arrangement, a realization of random gap forms a preamble to the pulse packet because it occurs before the leading pulse of the packet. The regular gap $T_{RE}$ may occur before or after the pulse packet, or it can be split into parts and suitably distributed within the total cycle duration ($T_{RA}$+L·$T_{CLK}$+$T_{RE}$).

The state decoder STD has K1 binary inputs driven by the pulse counter PCT and also U binary inputs driven by the source of random bits SRB via a storage register REG. The U bits supplied in parallel by the source SRB determine the packet select PS binary word. The system is arranged to operate in such a manner that the number $2^U$ of different PS words is equal to the number of all primary pulse packets to be used.

The state decoder STD has two outputs: one output CPT supplies a composite pulse train, whereas the other produces an end-of-cycle EOC pulse. Before each fresh cycle starts, the EOC pulse is employed to preset the initial PCT state and to load the register REG with a current PS binary word.

Other aspects of the operation of this implementation of the generator of a composite pulse train are similar to those applicable to the other implementations discussed above.

Figure 15:
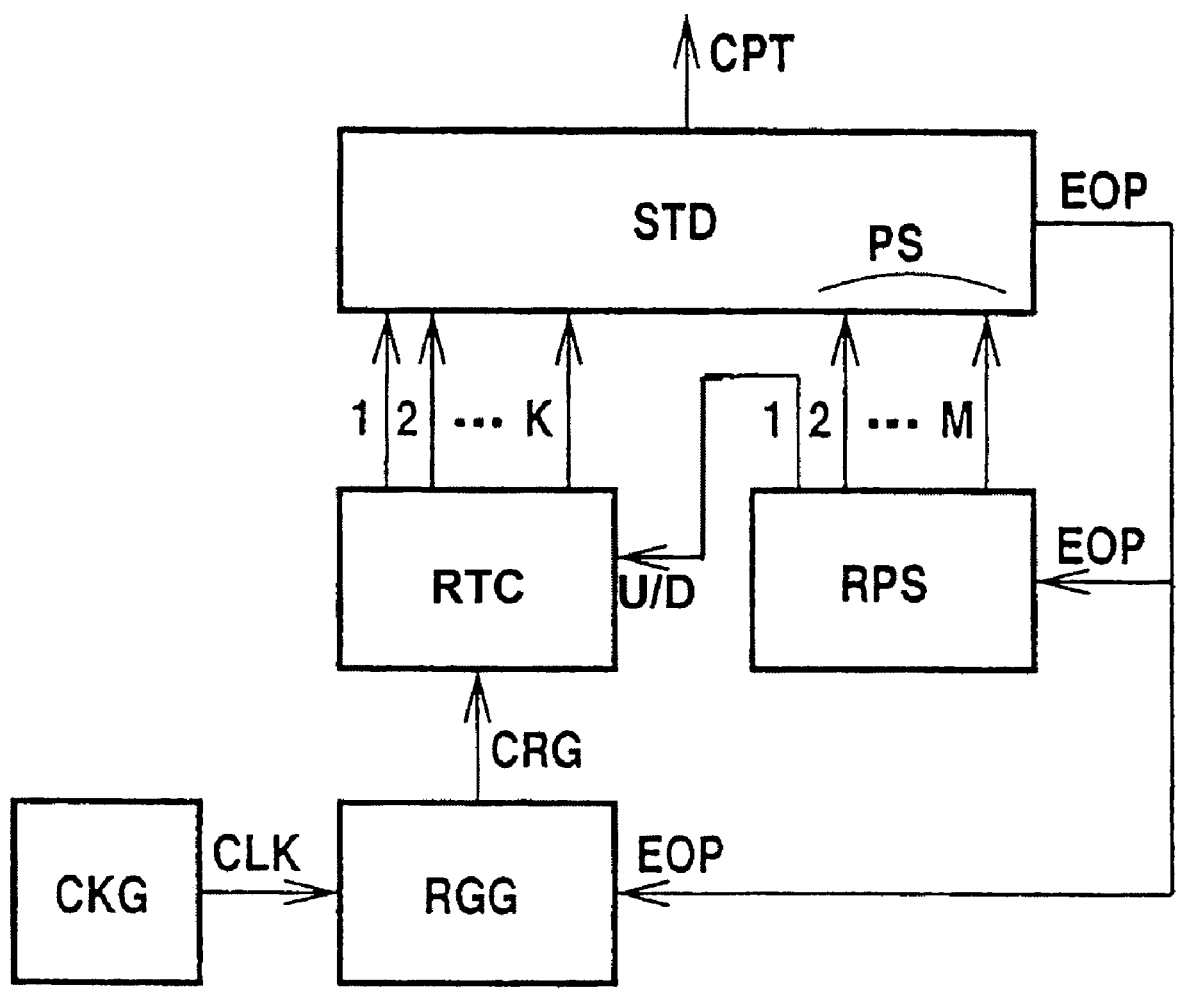
FIG. 15 is a block diagram of yet another system for generating composite pulse trains according to the present invention.

FIG. 15 is a block diagram of a modified version of the system of FIG. 9, in which the sequential state module SSM is implemented using a reversible counter RCT. The count direction is set by the state of an up/down control input U/D, which receives a single bit output of the random packet selector RPS. The remaining M-1 outputs form a packet select input PS of the state decoder STD, in this case a read-only memory.

The counter RCT, driven by clock pulses produced by the output CRG of the random gap generator RGG, supplies successively partial addresses to the memory STD. Each partial address, comprising K bits, is complemented by M-1 auxiliary bits provided by the packet select input PS. The complete address thus formed is used to access corresponding memory cells storing binary patterns that represent required pulse packets. Depending on the count direction, set by the state of the up/down control input U/D, the partial addresses appear in ascending or descending order. As a result, the memory STD produces at its output CPT pulse sequences that form, respectively, a pulse packet or its mirror image.

When the PS input is changed, the memory STD will produce at its output CPT a different primary pulse packet or its mirror image, depending on the count direction. The system is arranged to operate so that the number $2^{M-1}$ of different PS input values is equal to the number of primary pulse packets stored in the memory STD. By using a reversible counter, it is possible to derive time-reversed replicas of pulse packets without the need to store both versions.

The foregoing description of preferred embodiments of the invention has been presented for the purpose of illustration and description. It is not intended to be exhaustive or to limit the invention to the precise form disclosed. In light of the foregoing description, it is evident that many alterations, modifications, and variations will enable those skilled in the art to utilize the invention in various embodiments suited to the particular use contemplated. For example, each of the described embodiments could be modified by omitting the use of time-reversed replicas, the provision of random gaps between pulse trains and/or the random selection between different types of pulse trains, so long as the remaining features provide an adequate system.

In the arrangements described above, each pulse packet is randomly selected from a set thereof, and then is immediately available for selection as the next pulse train. In other words, each selection from the set is performed with immediate replacement. This is preferred, but not essential. The pulse trains could be selected in a random sequence without replacement until all have been used, or the selected pulse packets replaced after every n selections, where n is a predetermined integer.

Figure 1:
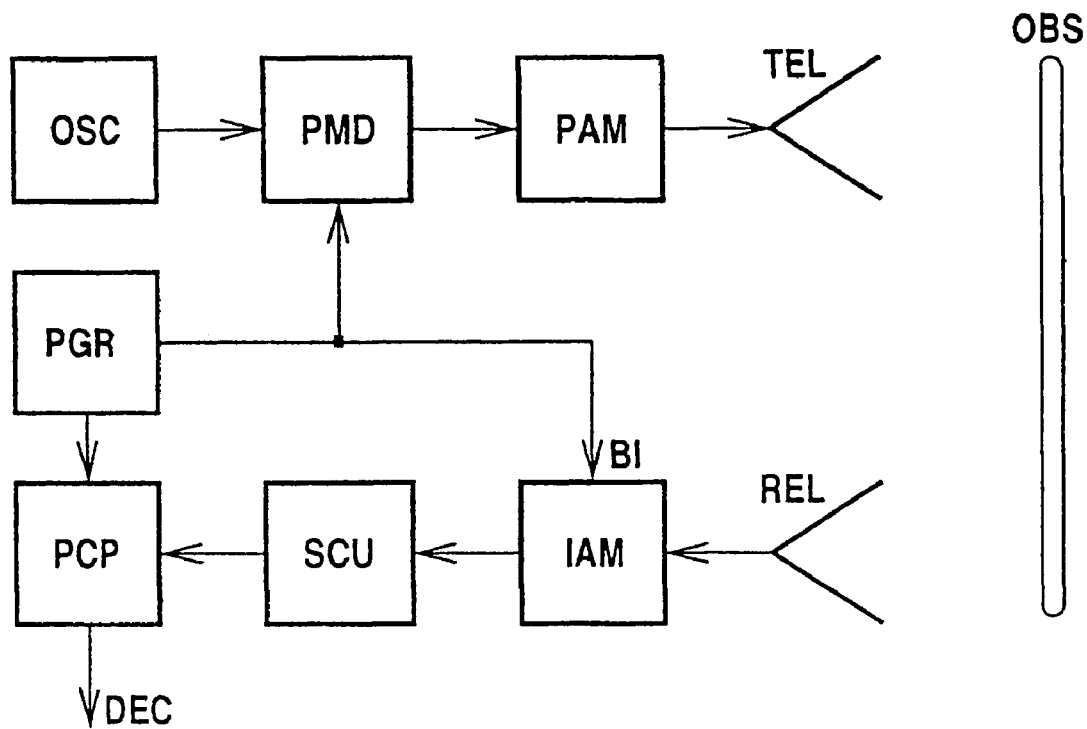
FIG. 1 is a block diagram of a typical obstacle-detection system utilizing short pulses.
Figure 3:
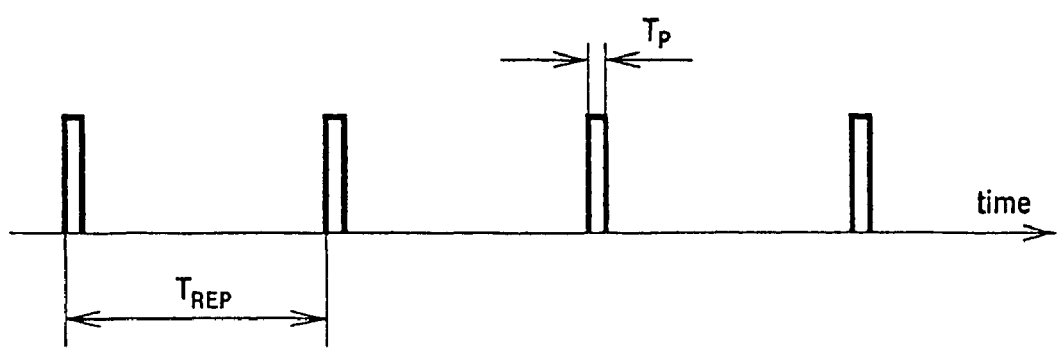
FIG. 3 depicts a periodic pulse train comprising rectangular pulses of duration $T_P$ and repetition period $T_{REP}$.
Figure 2:
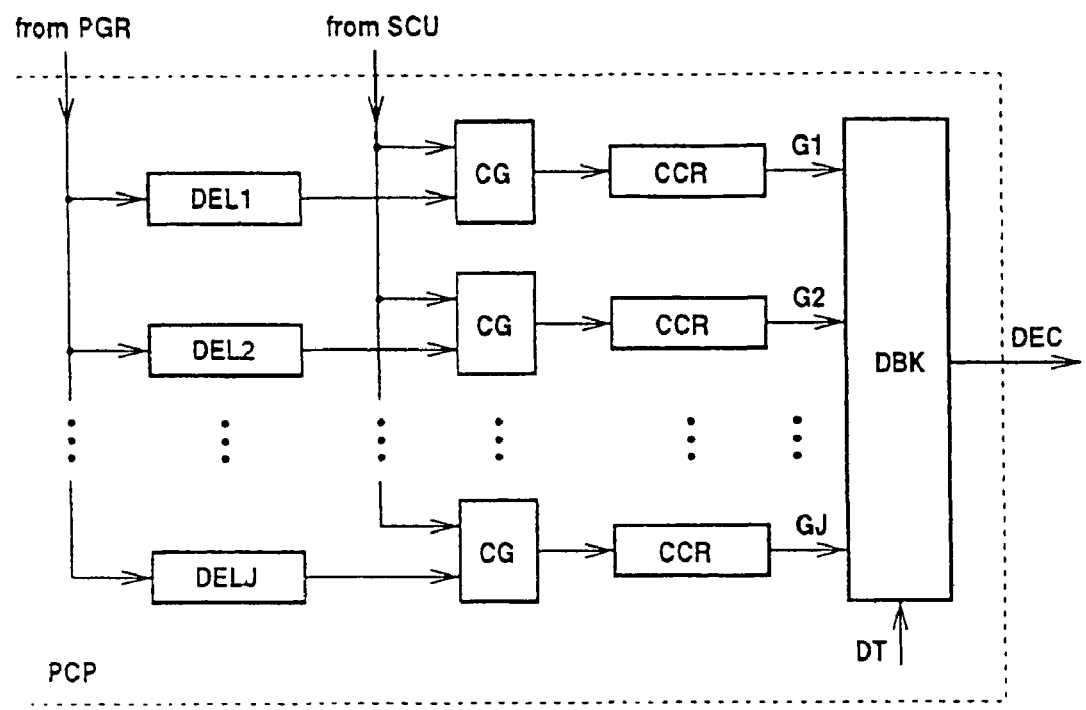
FIG. 2 is a block diagram of a multichannel pulse-coincidence processor utilized by the obstacle-detection system.
Figure 4:
FIG. 4 depicts a pulse packet which has good autocorrelation properties.
Figure 5:
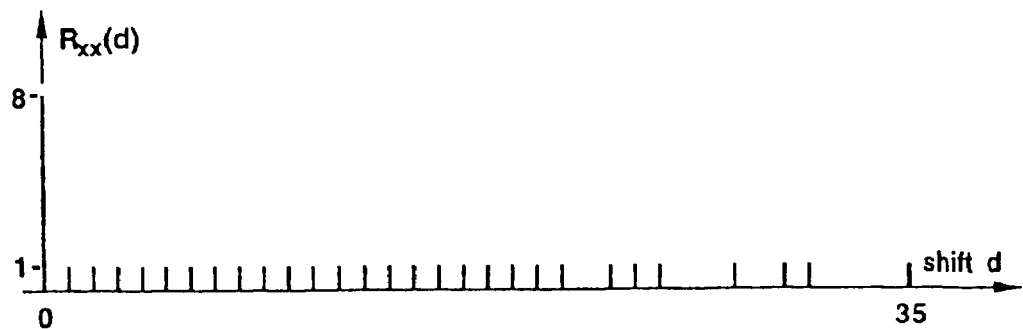
FIG. 5a depicts an autocorrelation sequence $R_{xx}(d)$ of a binary sequence representing the pulse packet of FIG. 4.
FIG. 5b depicts the autocorrelation function $R_{xx}(\tau)$ of the pulse packet.
Figure 5:
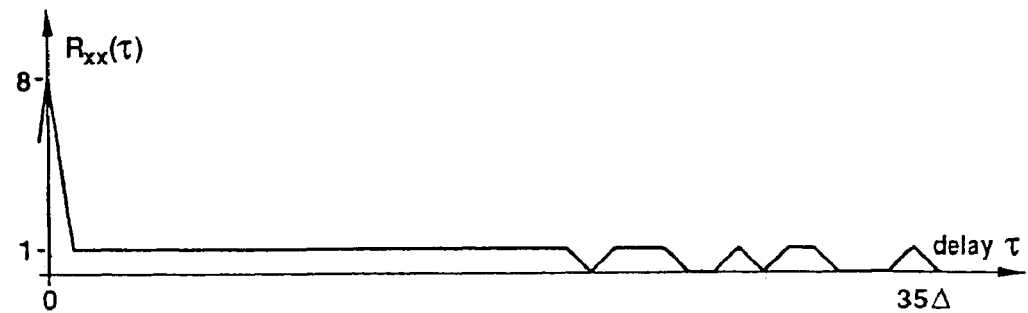
Figure 6:
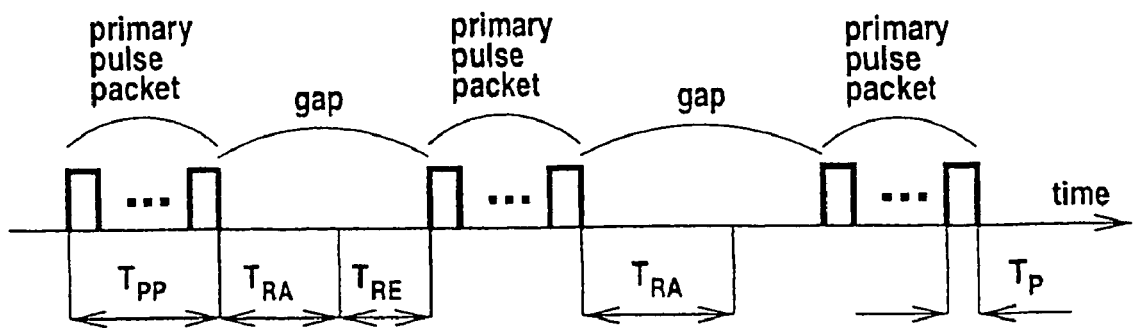
FIG. 6 depicts the structure of a composite pulse train constructed according to the present invention.
Figure 7:
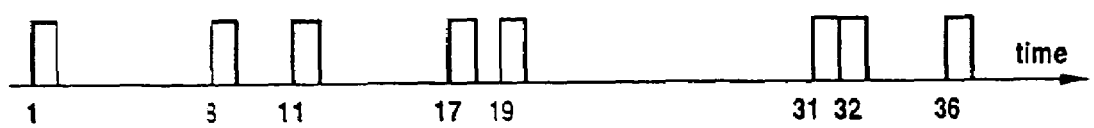
FIG. 7a is an example of a primary pulse packet.
FIG. 7b depicts another primary pulse packet obtained according to the present invention by time reversal of the first packet.
Figure 7:
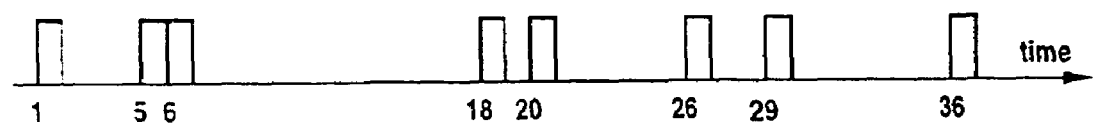
Figure 8:
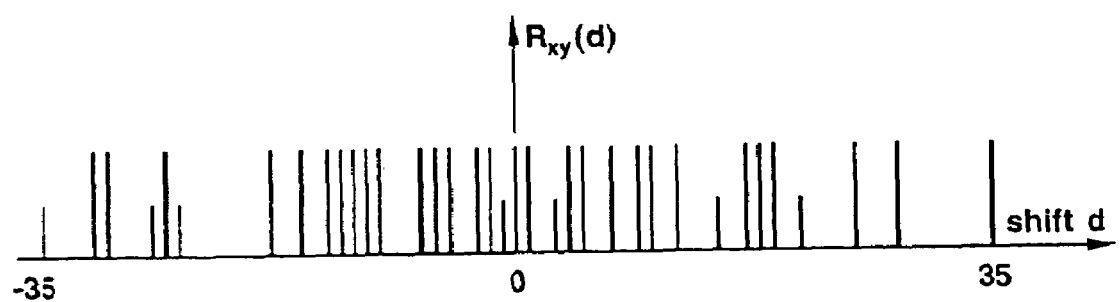
FIG. 8 depicts a cross-correlation sequence between two binary sequences that represent two pulse packets being time-reversed replicas of one another.

Any of the pulse generating systems of the above described embodiments can be used as the pulse generator PGR in an obstacle detection system as shown in FIG. 1. Such a system may be mounted on a movable platform (such as a vehicle or vessel), or on a stationary platform to detect the approach of a movable object. The system can be a collision-warning system arranged to generate a warning signal in response to detection of an object. Additionally or alternatively, the system may be a ranging aid having means, such as the arrangement of FIG. 2, for detecting the range of an obstacle and for generating a signal indicative of the range.

The term "random" is intended herein to include, without limitation, not only purely random, non-deterministically generated signals, but also pseudo-random and/or deterministic signals such as the output of a shift register arrangement provided with a feedback circuit as used in the prior art to generate pseudo-random binary signals, and chaotic signals.

The embodiments described herein can be implemented using dedicated hardware, incorporating for example digital signal processors, or using suitably-programmed general-purpose computers.

The invention claimed is:

1. Pulse generating apparatus for generating a sequence of pulse packets, each packet having interpulse spacings designed so that only a small number of pulse coincidences would occur between the packet and its replica shifted in time by more than one pulse duration, whereby the packet has an autocorrelation function which has a value, for all delays greater than one pulse duration, which is substantially smaller than the maximum value at zero delay;

the apparatus comprising a random gap generator for randomly selecting the duration of intervals between the pulse packets.

2. Apparatus as claimed in claim 1, wherein at least one of the pulse packets is a time-reversed replica of another of the pulse packets.

3. Apparatus as claimed in claim 2, wherein a plurality of the pulse packets are time-reversed replicas of others of the pulse packets.

4. Apparatus as claimed in claim 2, further comprising a counter, wherein each pulse packet is generated in response to said counter adopting successive states, the apparatus including a direction selector which, for each pulse packet, randomly selects the direction of operation of the counter.

5. Apparatus as claimed in claim 1, further comprising a pulse packet selector which randomly selects each pulse packet from a set of predetermined pulse packets.

6. Apparatus as claimed in claim 5, wherein the selected pulse packet is replaced in the set after each selection.

7. Obstacle detection apparatus for use in a multi-user environment comprising pulse generating apparatus as claimed in claim 1 for generating sequences of pulse packets, means for transmitting signals modulated by said pulse packets, receiving means for receiving reflections of the transmitted signals, and processing means for correlating the pulse packets with the received signals in order to detect the presence or absence of obstacles.

8. Obstacle detection apparatus as claimed in claim 7, including means for providing a signal indicative of the range of a detected object.

9. Obstacle detection apparatus as claimed in claim 7 for use in a vehicle or vessel to detect potential collisions.

10. A collision-warning system for a vehicle or vessel, the system comprising an obstacle detection apparatus as claimed in claim 9 and means for generating a warning signal in response to obstacle detection.

11. A ranging aid for a vehicle or vessel, the system comprising an obstacle detection apparatus as claimed in claim 9 and means for generating a signal indicative of the range of a detected obstacle.

12. Apparatus as claimed in claim 1, wherein the inter-pulse spacings are designed so that at most one pulse coincidence would occur between the packet and its replica shifted in time by more than one pulse duration.

13. Apparatus as claimed in claim 1, wherein the random gap generator is arranged to randomly select the durations of said intervals such that they have a uniform distribution.

14. Apparatus as claimed in claim 1, wherein the random gap generator is arranged to randomly select the durations of said intervals such that the minimum interval is less than or equal to the length of the longest pulse packet.

* * * * *